United States Patent
Yabe et al.

(10) Patent No.: US 6,911,661 B2
(45) Date of Patent: Jun. 28, 2005

(54) ELECTRON BEAM EXPOSURE APPARATUS

(75) Inventors: Takayuki Yabe, Tokyo (JP); Akio Yamada, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/409,542

(22) Filed: Apr. 8, 2003

(65) Prior Publication Data

US 2003/0168616 A1 Sep. 11, 2003

Related U.S. Application Data

(63) Continuation of application No. PCT/JP02/04593, filed on May 13, 2002.

(30) Foreign Application Priority Data

Jun. 18, 2001 (JP) .......................................... 2001-183490

(51) Int. Cl.[7] ................................................ H01J 37/09
(52) U.S. Cl. ............................ 250/492.23; 250/492.2; 250/492.22; 250/492.1; 250/492.3
(58) Field of Search ......................... 250/492.1, 492.2, 250/492.3, 492.22, 492.23; 428/323, 336, 141

(56) References Cited

U.S. PATENT DOCUMENTS

| | | | | |
|---|---|---|---|---|
| 5,334,282 A | * | 8/1994 | Nakayama et al. | 430/296 |
| 5,751,004 A | * | 5/1998 | Robinson et al. | 250/492.23 |
| 5,932,884 A | * | 8/1999 | Aizaki | 250/492.23 |
| 6,034,376 A | * | 3/2000 | Ema | 250/492.23 |
| 6,114,708 A | * | 9/2000 | Kojima et al. | 250/492.23 |
| 6,175,121 B1 | * | 1/2001 | Yamada et al. | 250/492.22 |
| 6,232,612 B1 | * | 5/2001 | Nakajima | 250/492.23 |
| 6,517,983 B2 | * | 2/2003 | Kamon | 430/30 |
| 6,627,905 B1 | * | 9/2003 | Hirayanagi | 250/492.22 |

FOREIGN PATENT DOCUMENTS

| | | |
|---|---|---|
| JP | 5-90140 | 4/1993 |
| JP | 6-338445 | 12/1994 |
| JP | 9-266153 | 10/1997 |

* cited by examiner

*Primary Examiner*—Nikita Wells
*Assistant Examiner*—Johnnie L Smith, II
(74) *Attorney, Agent, or Firm*—Morrison & Foerster LLP

(57) ABSTRACT

An electron beam exposure apparatus, which exposes patterns on a wafer by an electron beam, includes an electron beam producing unit which produces the electron beam and an electron beam shaping member having a plurality of openings which shape the electron beam. The 1st ratio, which is a ratio between opening width of the 1st opening among the plurality of the openings in the 1st direction, which is substantially perpendicular to irradiation direction of the electron beam, and pattern width of the pattern, which should be exposed on the wafer by the electron beam shaped by the 1st opening, in the direction corresponding to the 1st direction, and the 2nd ratio, which is a ratio between opening width of the 2nd opening among the plurality of the openings, in the 1st direction, and pattern width of the pattern, which should be exposed on the wafer by the electron beam shaped by the 2nd opening, in the direction corresponding to the 1st direction, are different.

7 Claims, 2 Drawing Sheets

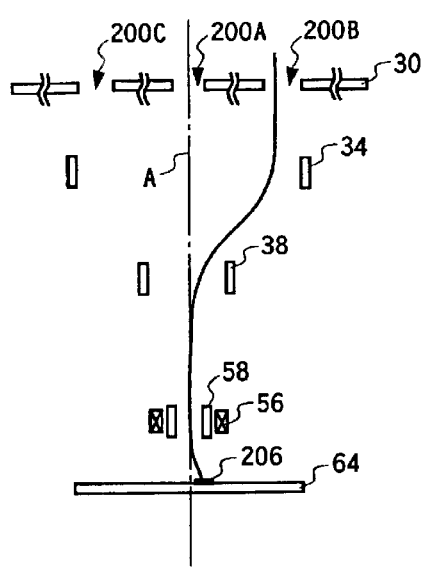
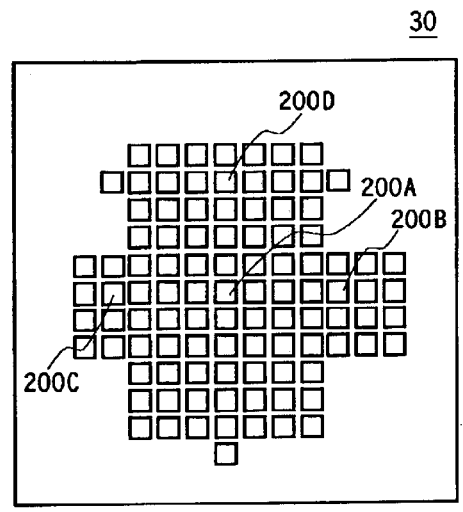
FIG. 2A
FIG. 2B
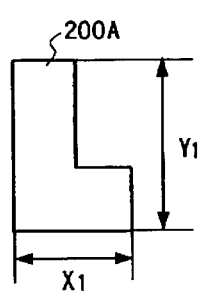
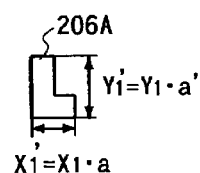
FIG. 2C
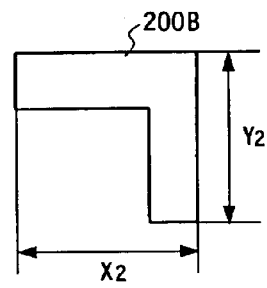
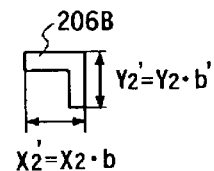
FIG. 2D

ELECTRON BEAM EXPOSURE APPARATUS

The present application is a continuation application of PCT application No. PCT/JP02/04593 filed on May 13, 2002. The present application claims priority from a Japanese Patent Application No. 2001-183490 filed on Jun. 18, 2001, the contents of which are incorporated herein by reference.

BACKGROUND OF THE INVENTION

The conventional electron beam exposure apparatus has electron gun which produces an electron beam, and a mask having a plurality of openings which shape the electron beams, the 1st deflector which deflects the electron beam to predetermined opening of the mask, the 2nd deflector which pushes back the electron beam deflected by the 1st deflector to a predetermined position, an aperture which has opening for the electron beam to pass through, the reduction lens which reduces the cross section of the electron beam in order to pass through the aperture, and a projection lens which projects on a wafer the electron beam which passed the aperture.

In the conventional electron beam exposure apparatus, a reduction rate and a rotation of the cross-sectional shape of the electron beam which is projected to the wafer is adjusted by adjusting lens power of the reduction lens and the projection lens.

However, in the conventional electron beam exposure apparatus, there is a case that the electron beam projected to the wafer does not have a desired cross-sectional shape when the mask shaped the electron beam by an opening other than the opening located in the center of the mask, and the reduction lens reduces an electron beam in portions other than a lens axis. In this case, there is a problem that the pattern, which should be exposed on the wafer, cannot be exposed precisely.

SUMMARY OF THE INVENTION

Therefore, it is an object of the present invention to provide an electron beam exposure apparatus which overcomes the foregoing issues in the related art. This object is achieved by combinations described in the independent claims. The dependent claims define further advantageous and exemplary combinations of the present invention.

In order to accomplish these purposes, according to the first aspect of the present invention, an electron beam exposure apparatus for exposing a pattern on a wafer using an electron beam is provided. The electron beam exposure apparatus includes an electron beam producing unit, which produces the electron beam, and an electron beam shaping member, having a plurality of openings which shape the electron beam. Wherein the 1st ratio, which is a ratio between an opening width of the 1st opening among the plurality of openings in the 1st direction substantially perpendicular to the irradiation direction of the electron beam, and a pattern width of the pattern, which should be exposed on the wafer by the electron beam shaped by the 1st opening, in the direction corresponding to the 1st direction, and the 2nd ratio, which is a ratio between an opening width of the 2nd opening among the plurality of openings, in the 1st direction, and a pattern width of the pattern, which should be exposed on the wafer by the electron beam shaped by the 2nd opening, in the direction corresponding to the 1st direction are different.

The 3rd ratio, which is a ratio between an opening width of the 1st opening among the plurality of openings, in the 2nd direction perpendicular to the 1st direction, and a pattern width of the pattern, which should be exposed on the wafer by the electron beam shaped by the 1st opening, in the direction corresponding to the 2nd direction, and the 4th ratio, which is a ratio between an opening width of the 2nd opening among the plurality of openings, in the 2nd direction, and a pattern width of the pattern which should be exposed on the wafer by the electron beam shaped by the 2nd opening, in the direction corresponding to the 2nd direction may be different. The 1st ratio and the 3rd ratio may be substantially the same as each other, while the 2nd ratio and the 4th ratio may be substantially the same as each other.

The 1st opening being located in a position more distant than the 2nd opening from predetermined position in the electron beam shaping member, the 2nd ratio maybe larger than the 1st ratio. The 1st opening and the 2nd opening being located in different directions from predetermined position in the electron beam shaping member, in substantially the same distance as each other from the predetermined position in the electron beam shaping member, the 2nd ratio may be larger than the 1st ratio.

This summary of invention does not necessarily describe all necessary features so that the invention may also be a sub-combination of these described features.

BRIEF DESCRIPTION OF THE DRAWINGS

FIGS. 2A to 2D show a shape of block in a mask, and shape of a pattern exposed on a wafer by passing through the block.

DETAILED DESCRIPTION OF THE INVENTION

Figure 1:
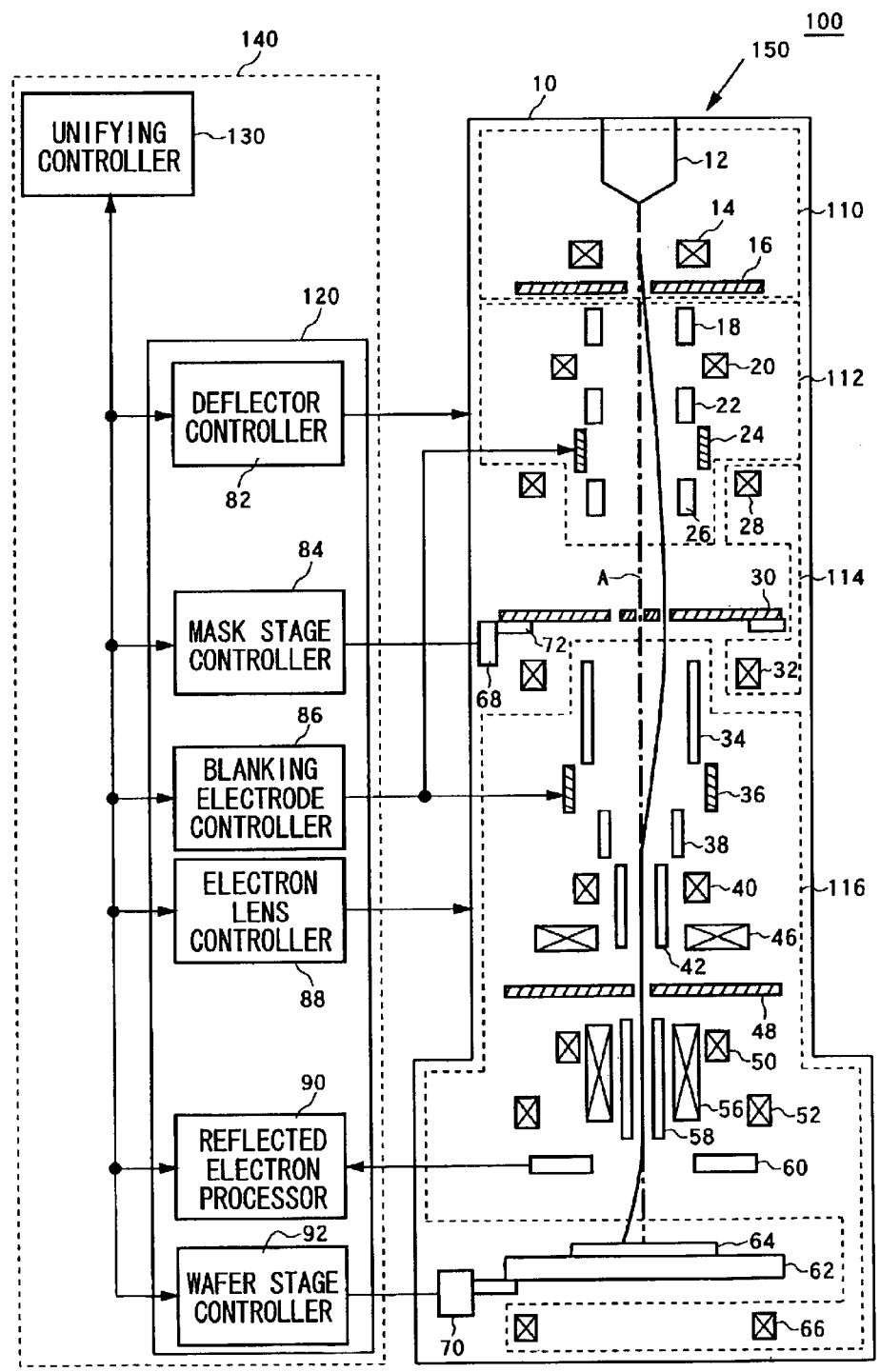
FIG. 1 shows an electron beam exposure apparatus 100 according to an embodiment of the present invention.

The invention will now be described based on the preferred embodiments, which do not intend to limit the scope of the present invention, but exemplify the invention. All of the features and the combinations thereof described in the embodiment are not necessarily essential to the invention.

FIG. 1 shows a configuration of an electron beam exposure apparatus 100 according to an embodiment of the present invention. The electron beam exposure apparatus 100 comprises an exposing unit 150 that executes a predetermined exposure process on a wafer 64 using an electron beam, and a controlling system 140 that controls the operation of each component of the exposing unit 150.

The exposing unit 150 has an electron beam irradiating system 110, a mask projection system 112, a focus adjusting lens system 114, a wafer projection system 116, and an electron optics system. The electron beam irradiating system 110 irradiates a predetermined electron beam. The mask projection system 112 deflects an electron beam, which is irradiated from an electron beam irradiating system 110, and also adjusts the imaging position of an electron beam at a periphery of a mask 30. The focus adjusting lens system 114 adjusts an imaging position of the electron beam at the periphery of the wafer 64. The electron optics system includes a wafer projection system 116 that deflects an electron beam, which passes through the mask 30, to a predetermined region of the wafer 64 positioned on the wafer stage 62. The wafer projection system 116 also adjusts a direction and a size of the image of the pattern, which is to be transcribed on the wafer 64.

Furthermore, the exposing unit 150 comprises a stage system that includes a mask stage 72, a mask stage driving unit 68, a wafer stage 62, and a wafer stage driving unit 70. The mask 30 is positioned on the mask stage 72. The mask 30 has a plurality of blocks on which each of the patterns that are to be exposed on the wafer 64 are shaped. The mask stage driving unit 68 drives the mask stage 72. The wafer 64, on which the pattern is exposed, is positioned on the wafer stage 62. Furthermore, the exposing unit 150 has an electron detector 60 that detects electrons scattered from the wafer stage 62 side, and converts this to an electric signal that corresponds to an amount of the scattered electrons, for adjusting the electron optics system.

The electron beam irradiating system 110 has a first electron lens 14 and a slit 16. The first electron lens 14 sets the focus position of an electron beam, which is generated at the electron gun 12 as an example of the electron beam producing unit. A rectangular shaped slit for the electron beam to pass through is shaped on the slit 16. Because the electron gun 12 needs a predetermined time to generate a stable electron beam, the electron gun 12 may continuously generate an electron beam during an exposing process period. A slit is preferably shaped in a shape which matches the shape of the block that includes a predetermined pattern shaped on the mask 30. In FIG. 1, the optical axis of the electron beam, when the electron beam irradiated from the electron beam irradiating system 110 is not deflected by the electron optics system, is expressed by the broken line A.

The mask projection system 112 has a first deflector 18, a second deflector 22, a third deflector 26, a second electron lens 20, and a first blanking electrode 24. The first deflector 18 and the second deflector 22 deflect the electron beam to operate as a deflecting system for a mask that deflects an electron beam. The second electron lens 20 operates as a focusing system for a mask that adjusts the focus of the electron beam. The first deflector 18 and the second deflector 22 deflect the electron beam, to irradiate the electron beam on the predetermined region of the mask 30.

For example, the predetermined region may be a block having a pattern to be transcribed into the wafer 64. The cross sectional shape of an electron beam becomes the same shape as the pattern because of the electron beam passing through the pattern. The image of the electron beam that passed through the block, on which a predetermined pattern is shaped, is defined as a pattern image. The third deflector 26 deflects the orbit of the electron beam which passed through the first deflector 18 and the second deflector 22, to be approximately parallel to the optical axis A. The second electron lens 20 has a function for imaging the image of the opening of the slit 16 on the mask 30, which is provided on the mask stage 72.

The first blanking electrode 24 deflects the electron beam so that the electron beam does not strike on the block shaped on the mask 30. The first blanking electrode 24 preferably deflects the electron beam such that the electron beam does not strike on the mask 30. Because the pattern shaped on the mask 30 deteriorates as the electron beam is irradiated on the pattern shaped on the mask 30, the first blanking electrode 24 deflects the electron beam at times other than when the pattern is transcribed onto the wafer 64. Therefore, the deterioration of the mask 30 can be prevented. The focus adjusting lens system 114 has a third electron lens 28 and a fourth electron lens 32. The third electron lens 28 and the fourth electron lens 32 focus the electron beam to the wafer 64.

The wafer projection system 116 has a fifth electron lens 40, a sixth electron lens 46, a seventh electron lens 50, an eighth electron lens 52, a ninth electron lens 66, a fourth deflector 34, a fifth deflector 38, a sixth deflector 42, a main deflector 56, a sub deflector 58, a second blanking deflector 36, and a round aperture 48.

The pattern image rotates due to the influence of an electric field and a magnetic field. The fifth electron lens 40 adjusts the amount of rotation of the pattern image of the electron beam, which passed through the predetermined block of the mask 30. The sixth electron lens 46 and the seventh electron lens 50 adjust a reduction ratio of the image pattern, which is transcribed onto the wafer 64, against the pattern shaped on the mask 30. The eighth electron lens 52 and the ninth electron lens 66 function as an object lens.

The fourth deflector 34 and the sixth deflector 42 deflect the electron beam in the direction of the optical axis A, downstream of the mask 30, in the forward direction of the electron beam. The fifth deflector 38 deflects the electron beam such that the electron beam runs approximately parallel to the optical axis A. The main deflector 56 and the sub deflector 58 deflect the electron beam such that the electron beam irradiates at the predetermined region to the wafer 64. In the present embodiment, the main deflector 56 is used for deflecting the electron beam between the sub fields that include a plurality of shot regions, which are regions that can be irradiated with one shot of the electron beam. The sub deflector 58 is used for deflecting the electron beam between the shot regions on the sub field.

The round aperture 48 has a round aperture. The second blanking deflector 36 deflects an electron beam such that the electron beam strikes on the outside of the round aperture. Therefore, the second blanking deflector 36 can prevent the electron beam from advancing past the round aperture 48, in the forward direction of the electron beam. Because the electron gun 12 always irradiates the electron beam during the exposing process period, the second blanking deflector 36 preferably deflects the electron beam such that the electron beam does not advance past the round aperture 48, when changing the pattern which is to be transcribed into the wafer 64, or when changing the region of the wafer 64 on which the pattern is to be exposed.

The controller system 140 comprises a unifying controller 130 and an individual controller 120. The individual controller 120 has a deflector controller 82, a mask stage controller 84, a blanking electrode controller 86, an electron lens controller 88, a reflected electron processor 90, and a wafer stage controller 92. The unifying controller 130 is, for example, a workstation that unifies and controls each of the controlling units which are included in the individual controller 120. The deflector controller 82 provide with the deflecting data, which shows amount of deflection, to the first deflector 18, the second deflector 22, the third deflector 26, the fourth deflector 34, the fifth deflector 38, the sixth deflector 42, the main deflector 56, and the sub deflector 58 so as to control the first deflector 18, the second deflector 22, the third deflector 26, the fourth deflector 34, the fifth deflector 38, the sixth deflector 42, the main deflector 56, and the sub deflector 58. The mask stage controller 84 controls the mask stage driving unit 68 to move the mask stage 72.

The blanking electrode controller 86 controls the first blanking electrode 24 and the second blanking deflector 36. In the present embodiment, the first blanking electrode 24 and the second blanking deflector 36 are preferably to be controlled such that the electron beam is irradiated to the wafer 64 during the exposing process, and the electron beam does not reach the wafer 64 except during the exposing process. The electron lens controller 88 controls the power, which is to be provided to the first electron lens 14, the second electron lens 20, the third electron lens 28, the fourth electron lens 32, the fifth electron lens 40, the sixth electron lens 46, the seventh electron lens 50, the eighth electron lens 52, and the ninth electron lens 66. The reflected electron processor 90 detects digital data, which shows an electron quantity based on the electric signal detected by the electron detector 60. The wafer stage controller 92 moves the wafer stage 62 to a predetermined position using the wafer stage driving unit 70.

An operation of the electron beam exposure apparatus 100 according to the present embodiment will be explained. The mask 30, which has a plurality of blocks on which a predetermined pattern is shaped, is provided on the mask stage 72, and the mask 30 is fixed to the predetermined position. The mask 30 is an example of the electron beam shaping member, and the block is an example of the opening. Furthermore, the wafer 64, on which an exposing process is executed, is provided on the wafer stage 62.

The wafer stage controller 92 moves the wafer stage 62 by the wafer stage driving unit 70, to locate the region of the wafer 64 which is to be exposed, at the periphery of the optical axis A. Moreover, because the electron gun 12 always irradiates the electron beam during the exposing process period, the blanking electrode controller 86 controls the first blanking electrode 24 and the second blanking deflector 36 such that the electron beam which passed through the opening of the slit 16, does not become irradiated to the mask 30 and the wafer 64.

In the mask projection system 112, the second electron lens 20 and the deflectors 18, 22, and 26 are adjusted such that the deflectors 18, 22, and 26 can deflect the electron beam to be irradiated on the block on which the pattern to be transcribed to the wafer 64 is formed. In the focus adjusting lens system 114, the electron lenses 28 and 32 are adjusted such that the electron beam is focused on the wafer 64. Moreover, in the wafer projection system 116, the electron lenses 40, 46, 50, 52, and 66, and the deflectors 34, 38, 42, 56, and 58 are adjusted such that the pattern image can be transcribed to the predetermined region of the wafer 64.

After adjusting the mask projection system 112, the focus adjusting lens system 114, and the wafer projection system 116, the blanking electrode controller 86 stops the deflection of the electron beam by the first blanking electrode 24 and the second blanking deflector 36. Thereby, the electron beam is irradiated to the wafer 64 through the mask 30. The electron gun 12 generates an electron beam, and the first electron lens 14 adjusts the focus position of the electron beam, to irradiate the electron beam to the slit 16. Then, the first deflector 18 and the second deflector 22 deflect the electron beam, which passed through the opening of the slit 16, to irradiate the electron beam to the predetermined region of the mask 30, on which the pattern to be transcribed is shaped.

The electron beam, which passed through the opening of the slit 16, has a rectangular cross section. The electron beam, which is deflected by the first deflector 18 and the second deflector 22, is deflected to be approximately parallel to the optical axis A by the third deflector 26. Moreover, the electron beam is adjusted such that the image of the opening of the slit 16 is imaged at the predetermined region on the mask 30 by the second electron lens 20.

Then, the electron beam that passed through the pattern, which is shaped on the mask 30, is deflected to the direction close to the optical axis A by the fourth deflector 34 and the sixth deflector 42, and the electron beam is deflected to be approximately parallel to the optical axis A by the fifth deflector 38. Moreover, the electron beam is adjusted such that the image of the pattern which is shaped on the mask 30, is focused on the surface of the wafer 64 by the third electron lens 28 and the fourth electron lens 32. The rotation amount of the electron beam is adjusted by the fifth electron lens 40, and the ratio of reduction of the pattern image is adjusted by the sixth electron lens 46 and the seventh electron lens 50.

Then, the electron beam is deflected, and is irradiated to the predetermined shot region on the wafer 64 by the main deflector 56 and the sub deflector 58. In the present embodiment, the main deflector 56 deflects the electron beam between the sub fields that include a plurality of shot regions. The sub deflector 58 deflects the electron beam between the shot regions in the sub field. The electron beam deflected to the predetermined shot region is adjusted by the eighth electron lens 52 and the ninth electron lens 66 and is irradiated to the wafer 64. Thereby, the pattern image shaped on the mask 30 is transcribed onto the predetermined shot region on the wafer 64.

After the predetermined exposure period has elapsed, the blanking electrode controller 86 controls the first blanking electrode 24 and the second blanking deflector 36 to deflect the electron beam, so that the electron beam does not irradiate the mask 30 and the wafer 64. The above-mentioned process exposes the pattern shaped on the mask 30 exposed on the predetermined shot region on the wafer 64.

To expose the pattern which is shaped on the mask 30 to the next shot region, in the mask projection system 112, the second electron lens 20 and the deflectors 18, 22, and 26 are adjusted such that the deflectors 18, 22, and 26 can deflect the electron beam to be irradiated on the block on which the pattern to be transcribed to the wafer 64 is formed. In the focus adjusting lens system 114, the electron lenses 28 and 32 are adjusted such that the electron beam is focused on the wafer 64. Moreover, in the wafer projection system 116, the electron lenses 40, 46, 50, 52, and 66, and the deflectors 34, 38, 42, 56, and 58 are adjusted such that the pattern image can be transcribed to the predetermined region of the wafer 64.

Specifically, the sub deflector 58 adjusts the electric field such that the pattern image generated by the mask projection system 112 is exposed to the next shot region. Then, the pattern is exposed to the shot region as shown above. After exposing the pattern to the entire shot region on which the pattern inside the sub field is to be exposed, the main deflector 56 adjusts the magnetic field such that the pattern can be exposed to the next sub field. The electron beam exposure apparatus 100 can expose the desired circuit pattern on the wafer 64 by repeatedly performing the above-mentioned exposing process.

The electron beam exposure apparatus 100, as an electron beam processing apparatus of the present invention, may be an electron beam exposure apparatus using a variable rectangle device, and may be an electron beam exposure apparatus using a blanking aperture array device. Moreover, the electron beam processing apparatus of the present invention maybe a multi-beam exposure apparatus, which exposes patterns on a wafer by a plurality of electron beams.

FIG. 2A–2D are drawings to explain the shape of the opening of the mask 30, and the shape of the pattern to be exposed on the wafer by passing through the block. FIG. 2A is a sectional view of the mask 30 and the wafer 64. Moreover, FIG. 2B is an upper view of the mask 30. The mask 30 of the present embodiment has a plurality of openings 200 which shape electron beams. The mask 30 shapes an electron beam by having the electron beam pass through one opening among a plurality of the openings 200. And the 4th deflector 34 deflects the electron beam, which has passed through the opening 200C, the opening 200A, or the opening 200B, toward the optical axis A. And the 5th deflector 38 deflects the electron beam, which has been deflected by the 4th deflector 34, in nearly perpendicular direction to the wafer 64. Then, the main deflector 56 and the sub deflector 58 deflects the electron beam, which has been deflected by the 5th deflector 38, so that the electron beam is irradiated to the predetermined area on the wafer 64.

Thus, the desired pattern 206 is exposed on the wafer 64. A plurality of the openings of the mask 30 according to the present embodiment are designed in the shape, which anticipates unintended deformation of the cross-sectional shape of the electron beam, based on the position of the openings in the mask 30, in order to expose desired patterns by each electron beam, which each of the openings shaped respectively. For example, a plurality of openings are designed in different size based on the reduction rate of the electron beam, which changes depending on passing positions in the electron lens.

FIG. 2C shows a opening 200A of the mask 30, and a pattern 206A, which was shaped by the opening 200A and exposed on the wafer 64. And FIG. 2D shows the opening 200B of the mask 30, and the pattern 206B, which was shaped by the opening 200B and exposed on the wafer 64.

As shown in FIG. 2C and FIG. 2D, the ratio "a" between the opening width X1 of the opening 200A in the 1st direction substantially perpendicular to the irradiation direction of the electron beam, and the pattern width X1' of the pattern 206A, which is exposed on the wafer 64 by the electron beam shaped by the opening 200A, in the direction corresponding to the 1st direction, differs from the ratio "b" between the opening width X2 of the opening 200B in the 1st direction, and the pattern width X2' of the pattern, which is exposed on the wafer 64 by the electron beam shaped by the opening 200B, in the direction corresponding to the 1st direction.

Moreover, the ratio "a'" between the opening width Y1 of the opening 200A in the 2nd direction perpendicular to the 1st direction, and the pattern width Y1' of the pattern, which is exposed on the wafer 64 by the electron beam shaped by the opening 200A, in the direction corresponding to the 2nd direction, differs from the ratio "b'" between the opening width Y2 of the opening 200B in the 2nd direction, and the pattern width Y2' of the pattern, which is exposed on the wafer 64 by the electron beam shaped by the opening 200B, in the direction corresponding to the 2nd direction.

According to the electron beam exposure apparatus 100 of the present embodiment, since the mask 30 has a plurality of the openings in the shape, which anticipates unintended deformation of the cross-sectional shape of the electron beam, it is possible to irradiate an electron beam in desired shape on the wafer no matter which opening shapes the electron beam.

In another embodiment, the ratio "a" may be nearly equal to the ratio "a'", and the ratio "b" may be nearly equal to the ratio "b'". That is, the opening 200A may be in the shape resulted from expanding the pattern 206A, which is exposed on the wafer 64 by the electron beam shaped by the opening 200A, with magnification 1/a (=1/a'), and the opening 200B may be in the shape resulted from expanding the pattern 206B, which is exposed on the wafer 64 by the electron beam shaped by the opening 200B, with magnification 1/b (=1/b'). According to the mask 30 of the present embodiment, since a plurality of the openings are in the shape, which anticipate the difference in the reduction rate of the electron beam depending on the converging position in the electron lens, even if the electron beams are converged in different positions in the magnetic field formed by the electron lens, it is possible to expose patterns in desired shape.

Moreover, as shown in FIG. 2A and FIG. 2B, if the opening 200B is located in a position more distant than the opening 200A from a predetermined position in the mask 30, the ratio "b" may be larger or smaller than the ratio "a". That is, the ratio between the size of a opening and the size of a pattern, which is exposed on the wafer 64 by the electron beam shaped by the opening may be changed, depending on the distance from the center of the mask 30, the opening 200A, the optical axis A, or the lens axis of the electron lens. Besides, the ratio "b" may be nearly equal to the ratio "d", which is the ratio between the opening width of the opening 200D, which is in almost same distance as the opening 200B from the center of the mask 30, the opening 200A, the optical axis A, or the lens axis as a center axis of a pupil of the electron lens, and the size of the pattern, which is exposed on the wafer 64 by the electron beam that is shaped by the opening 200D, in the direction corresponding to the 1st direction. According to the mask 30 of the present embodiment, since a plurality of the openings are in the shape depending on the distance from the predetermined position in the mask 30, even if the reduction rate of an electron beam changes depending on the distance from the lens axis of the electron lens, it is possible to expose a pattern in desired shape.

Moreover, as shown in FIG. 2A and FIG. 2B, when the opening 200C and the opening 200B are located in different directions from the predetermined position in the mask 30, in substantially the same distance as each other from the predetermined position in the mask 30, the ratio "b" may be larger or smaller than a ratio "e", which is the ratio between the opening width of the opening 200C in the 1st direction and the pattern width of the pattern exposed on the wafer 64 by the electron beam shaped by the opening 200C, in the direction corresponding to the 1st direction. That is, the ratio between the size of the opening and the size of the pattern exposed on the wafer 64 by the electron beam shaped by the opening, may be changed depending on the direction from the center of the mask 30, the opening 200A, the optical axis A, or the lens axis of the electron lens. According to the mask 30 of the present embodiment, since a plurality of the openings are in the shape depending on the direction from the predetermined position in the mask 30, even if the reduction rate of the electron beam changes depending on the direction from the lens axis of the electron lens, it is possible to expose the pattern in desired shape.

In another embodiment, while the opening 200C and the opening 200D being located in the different direction from the predetermined position in the mask 30, in substantially the same distance as each other from the predetermined position in the mask 30, the ratio "d'" between the opening width of the opening 200D in the 3rd direction, which is the direction from the predetermined position in the mask 30, and the pattern width of the pattern exposed on the wafer 64 by the electron beam shaped by the opening 200D, in the direction corresponding to the 3rd direction, may be larger or smaller than the ratio "e'", which is a ratio between the opening width of the opening 200C in the 4th direction, which is the direction from the predetermined position in the mask 30, and the pattern width of the pattern exposed on the wafer 64 by the electron beam shaped by the opening 200C in the direction corresponding to the 4th direction. That is, the ratio between the size of the opening and the size of the pattern exposed on the wafer 64 by the electron beam shaped by the opening, may be changed depending on the direction from the center of the mask 30, the opening 200A, the optical axis A, or the lens axis of the electron lens.

According to the mask 30 of the present embodiment, since a plurality of the openings are in the shape depending on the direction from the predetermined position in the mask 30, even if the magnetic field, which is formed by the electron lens, is distorted, it is possible to expose a pattern in desired shape.

According to the electron beam exposure apparatus 100 of the present embodiment, since the mask 30 has a plurality of the openings in the shape, which anticipates unintended deformation of the cross-sectional shape of the electron beam caused by the difference in the shrink rate depending on the convergence position in the electron lens, it is possible to irradiate an electron beam in desired shape on the wafer no matter which opening shapes the electron beam.

As a result, according to the electron beam exposure equipment 100 of the present embodiment, it is possible to expose a pattern on the wafer in high accuracy.

Although the present invention has been described by way of exemplary embodiments, it should be understood that many changes and substitutions may be made by those skilled in the art without departing from the spirit and the scope of the present invention which is defined only by the appended claims.

As shown above, according to the present invention, an electron beam exposure apparatus is provided, which exposes a pattern on a wafer in high accuracy.

What is claimed is:

1. An electron beam exposure apparatus, which exposes patterns on a wafer by an electron beam, having a lens, comprising:

an electron beam producing unit which produces said electron beam; and an electron beam shaping member having a plurality of openings which shape the electron beam, wherein a 1st ratio, which is a ratio between an opening width of a 1st opening among said plurality of the openings in a 1st direction, which is substantially perpendicular to an irradiation direction of the electron beam, and a pattern width of a first pattern, which should be exposed on the wafer by the electron beam shaped by said 1st opening, in the direction corresponding to said 1st direction, and a 2nd ratio, which is a ratio between an opening width of a 2nd opening among said plurality of the openings, in said 1st direction, and a pattern width of a second pattern, which should be exposed on the wafer by the electron beam shaped by said 2nd opening, in the direction corresponding to said 1st direction, are different and wherein said 1st opening is disposed close to a center axis of the lens, and said 2nd opening is disposed farther than a location where the first pattern is disposed from the center axis of the lens.

2. An electron beam exposure apparatus as claimed in claim 1, wherein a 3rd ratio, which is a ratio between an opening width of said 1st opening among said plurality of the openings, in a 2nd direction, which is perpendicular to said 1st direction, and a pattern width of the first pattern, which should be exposed on the wafer by the electron beam shaped by said 1st opening, in the direction corresponding to said 2nd direction, and a 4th ratio, which is a ratio between an opening width of said 2nd opening among said plurality of the openings, in said 2nd direction, and a pattern width of the second pattern which should be exposed on the wafer by the electron beam shaped by said 2nd opening, in the direction corresponding to said 2nd direction, are different.

3. An electron beam exposure apparatus as claimed in claim 2, wherein said 1st ratio and said 3rd ratio are substantially the same as each other, and said 2nd ratio and said 4th ratio are substantially the same as each other.

4. An electron beam exposure apparatus as claimed in the claim 1, wherein said 1st opening is located in a position more distant than said 2nd opening from a predetermined position in said electron beam shaping member, while said 2nd ratio being larger than said 1st ratio.

5. An electron beam exposure apparatus as claimed in the claim 1, wherein said 1st opening and said 2nd opening are located in different directions from a predetermined position in said electron beam shaping member, in substantially the same distance as each other from said predetermined position in said electron beam shaping member, while said 2nd ratio being larger than said 1st ratio.

6. An electron beam exposure apparatus as claimed in the claim 1, wherein said first and second patterns are the same.

7. A mask disposed in an electron beam exposure apparatus for projecting an image on a wafer in accordance with operation of a lens, comprising:

a plurality of patterns for shaping the electron beam, comprising:

a first pattern disposed close to a center axis of the lens and having a first reducing ratio in width used for projecting a first image on the wafer; and a second pattern disposed farther than a location where the first pattern is disposed from the center axis of the lens, said second pattern having a second reducing ratio in width used for projecting a second image on the wafer, wherein said first reducing ratio is different from said second reducing ratio.

* * * * *